US012563665B2

(12) United States Patent
Morimoto et al.

(10) Patent No.: US 12,563,665 B2
(45) Date of Patent: Feb. 24, 2026

(54) INSULATING CIRCUIT BOARD AND SEMICONDUCTOR DEVICE IN WHICH SAME IS USED

(71) Applicants: KABUSHIKI KAISHA TOSHIBA, Tokyo (JP); TOSHIBA MATERIALS CO., LTD., Yokohama (JP)

(72) Inventors: Kazumitsu Morimoto, Yokohama Kanagawa (JP); Hideaki Hirabayashi, Yokohama Kanagawa (JP)

(73) Assignee: NITERRA MATERIALS CO., LTD., Yokohama (JP)

( * ) Notice: Subject to any disclaimer, the term of this patent is extended or adjusted under 35 U.S.C. 154(b) by 109 days.

(21) Appl. No.: 18/339,515

(22) Filed: Jun. 22, 2023

(65) Prior Publication Data

US 2023/0345630 A1      Oct. 26, 2023

Related U.S. Application Data

(63) Continuation of application No. PCT/JP2021/047606, filed on Dec. 22, 2021.

(30) Foreign Application Priority Data

Dec. 24, 2020      (JP) ................................. 2020-214952

(51) Int. Cl.
*H05K 1/03*          (2006.01)

(52) U.S. Cl.
CPC .................................. *H05K 1/0306* (2013.01)

(58) Field of Classification Search
CPC .......... H01B 1/02; H01B 1/023; H01B 1/026; C04B 2237/407

(Continued)

(56) References Cited

U.S. PATENT DOCUMENTS 10,973,120 B1 * 4/2021 Lee ...................... B32B 27/285
2017/0358489 A1 * 12/2017 Maeshima ........ H01L 23/53238
(Continued)

FOREIGN PATENT DOCUMENTS

EP          3031789 A1      6/2016
EP          3683335          7/2020
(Continued)

OTHER PUBLICATIONS

Extended European Search Report issued Feb. 12, 2025 in corresponding European Patent Application No. 21910872.7.

*Primary Examiner* — Timothy J Thompson
*Assistant Examiner* — Sidi M Maiga
(74) *Attorney, Agent, or Firm* — Harness, Dickey & Pierce, P.L.C.

(57) ABSTRACT

According to an embodiment, a ceramic copper circuit board in which the reliability of bonding with a bonding layer is improved is provided, and an insulating circuit board includes an insulating substrate and a conductor part bonded to at least one surface of the insulating substrate. In XPS analysis of a nitrogen amount at the conductor part surface, an average value of the nitrogen amount at any three locations is within a range of not less than 0 at % and not more than 50 at %. In XPS analysis of the oxygen amount at the conductor part surface, the average value of the three locations is favorably within the range of not less than 3 at % and not more than 30 at %. The ratio of the nitrogen amount to the oxygen amount is favorably not less than 0 and not more than 5.

16 Claims, 1 Drawing Sheet

(58) Field of Classification Search
USPC ......................................................... 361/783
See application file for complete search history.

(56) References Cited

U.S. PATENT DOCUMENTS

| | | | | |
|---|---|---|---|---|
| 2018/0005918 | A1 | 1/2018 | Naba et al. | |
| 2019/0327831 | A1 | 10/2019 | Kato et al. | |
| 2020/0170118 | A1 | 5/2020 | Kato et al. | |
| 2021/0068253 | A1 | 3/2021 | Kato et al. | |
| 2021/0395452 | A1* | 12/2021 | Arisawa ............... | H05K 1/0326 |
| 2023/0268245 | A1* | 8/2023 | Yuki .................... | C04B 37/026 |
| | | | | 257/678 |

FOREIGN PATENT DOCUMENTS

| | | |
|---|---|---|
| JP | 2007-081217 | 3/2007 |
| JP | 2013-055264 | 3/2013 |
| JP | 2020-059228 | 4/2020 |
| JP | 2020-161524 | 10/2020 |
| WO | WO-2017/056360 A1 | 4/2017 |
| WO | WO-2018/180965 | 10/2018 |
| WO | WO-2019/054291 | 3/2019 |
| WO | WO-2019/054294 | 3/2019 |
| WO | WO-2019-221174 A1 | 11/2019 |

* cited by examiner

INSULATING CIRCUIT BOARD AND SEMICONDUCTOR DEVICE IN WHICH SAME IS USED

CROSS-REFERENCE TO RELATED APPLICATIONS

This is a continuation application of International Patent Application PCT/JP2021/047606, filed on Dec. 22, 2021; and also claims priority to Japanese Patent Application No. 2020-214952, filed on Dec. 24, 2020; the entire contents of which are incorporated herein by reference.

FIELD

Embodiments described below relate generally to an insulating circuit board and a semiconductor device using an insulating circuit board.

BACKGROUND

There is an insulating circuit board in which an insulating substrate and a conductor part are bonded. A ceramic copper circuit board, which is one type of insulating circuit board, is used as a circuit board to which a semiconductor element or the like is mounted. WO 2017/056360 (Patent Literature 1) describes a bonded body in which a ceramic substrate and a copper plate are bonded via a bonding layer and a ceramic copper circuit board in which the bonded body is improved. In Patent Literature 1, a jutting portion is included in which a bonding layer juts from the copper plate end portion. The temperature cycle test (TCT) characteristics are improved by controlling the size of such a jutting portion of the bonding layer.

A semiconductor device is obtained by mounting a semiconductor element to the ceramic copper circuit board. A solder layer or a silver paste is used to mount the semiconductor element. The solder layer or the silver paste secures the bond between the ceramic copper circuit board and the semiconductor element. A phenomenon had been occurring in which bonding reliability of the solder layer was insufficient when the semiconductor element was mounted via the solder layer to the ceramic copper circuit board of Patent Literature 1. An investigation of the cause showed that the nitrogen amount at the copper plate surface was the cause.

DETAILED DESCRIPTION

An insulating circuit board according to an embodiment includes an insulating substrate, and a conductor part bonded to at least one surface of the insulating substrate, wherein in XPS analysis of a nitrogen amount at a surface of the conductor part, an average value of the nitrogen amount at any three locations is within a range of not less than 0 at % and not more than 50 at %. The conductor part is, for example, a copper member made of copper or a copper alloy.

Figure 1:
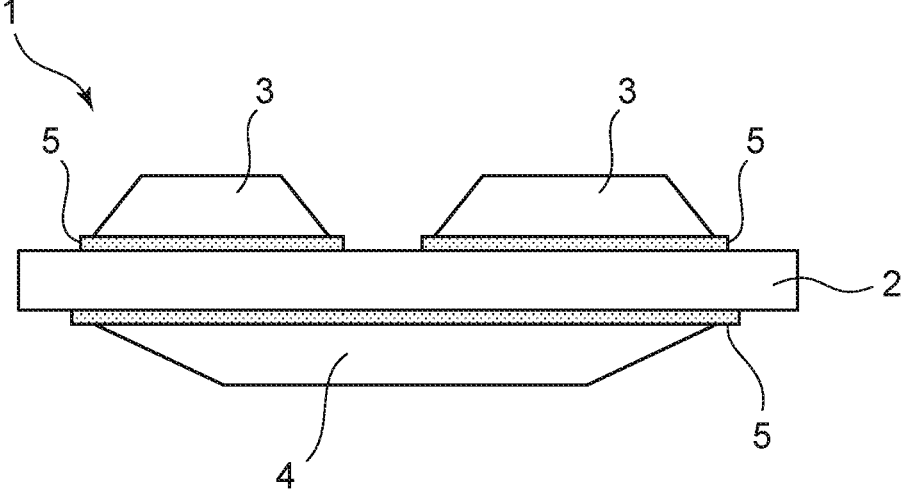
FIG. 1 is a schematic view showing an example of an insulating circuit board according to an embodiment.

FIG. 1 is a schematic view showing an example of the insulating circuit board according to the embodiment. In FIG. 1, 1 is an insulating circuit board, 2 is an insulating substrate, 3 is a conductor part (a front conductor part), 4 is a conductor part (a back conductor part), and 5 is a bonding layer. In the insulating circuit board 1 illustrated in FIG. 1, the conductor part 3 and the conductor part 4 are located at two surfaces of the insulating substrate 2 with the bonding layer 5 interposed. In the structure shown in FIG. 1, the conductor part 3 is provided with a circuit configuration; and the conductor part 4 is used as a heat dissipation plate. For convenience, the conductor part 3 is called the front conductor part; and the conductor part 4 is called the back conductor part. Also, two front conductor parts 3 are provided. The insulating circuit board according to the embodiment is not limited to such a configuration; one, three or more front conductor parts may be provided. A circuit configuration may be provided in the back conductor part 4. The insulating circuit board may include only the front conductor part 3 without including the back conductor part 4. It is favorable for the insulating circuit board according to the embodiment to be a ceramic copper circuit board.

It is favorable for the insulating substrate to be a resin substrate or a ceramic substrate. A resin substrate is less expensive than a ceramic substrate and is favorable when considering cost. The resin substrate is, for example, a paper phenol substrate, paper epoxy substrate, glass epoxy substrate, composite base material epoxy substrate, glass composite substrate, glass polyimide substrate, bismaleimide-triazine (BT) substrate, fluorocarbon resin substrate, polyphenylene oxide (PPO) substrate, etc.

Compared to a resin substrate, a ceramic substrate has excellent heat dissipation and three-point bending strength. It is favorable for the ceramic substrate to include one or two selected from silicon nitride, aluminum nitride, sialon, alumina, and zirconia as a major component. Major component refers to a component included as not less than 50 mass %. Furthermore, it is more favorable for the ceramic substrate to be one of a silicon nitride substrate, an aluminum nitride substrate, or an Alusil substrate. Alusil is a material that includes a total of not less than 50 mass % of the two components of alumina and zirconia.

It is favorable for the thickness of the insulating substrate to be not less than 0.1 mm and not more than 1 mm. The strength may be reduced when the substrate thickness is less than 0.1 mm. When the substrate thickness is greater than 1 mm, the insulating substrate itself may become a thermal resistor and may degrade the heat dissipation of the insulating circuit board.

It is favorable for the three-point bending strength of the silicon nitride substrate to be not less than 600 MPa. It is favorable for the thermal conductivity of the silicon nitride substrate to be not less than 80 W/m·K. The substrate thickness can be reduced by increasing the strength of the silicon nitride substrate. It is therefore favorable for the three-point bending strength of the silicon nitride substrate to be not less than 600 MPa, or even not less than 700 MPa. The thickness of the silicon nitride substrate can be thin, i.e., not more than 0.40 mm, or even not more than 0.30 mm. Also, the three-point bending strength of the aluminum nitride substrate is about 300 to 450 MPa. On the other hand, the thermal conductivity of the aluminum nitride substrate is not less than 160 W/m·K. Because the strength of the aluminum nitride substrate is low, it is favorable for the substrate thickness to be not less than 0.60 mm.

Although the three-point bending strength of an aluminum oxide substrate is about 300 to 450 MPa, an aluminum oxide substrate is an inexpensive ceramic substrate. Although the three-point bending strength of an Alusil substrate is high, i.e., about 550 MPa, the thermal conductivity is about 30 to 50 W/m·K. An Alusil substrate is a substrate made of a sintered body in which aluminum oxide and zirconium oxide are mixed.

A ceramic substrate is favorable as the insulating substrate 2. Among ceramic substrates, one of a silicon nitride substrate or an aluminum nitride substrate is more favorable. Silicon nitride substrates and aluminum nitride substrates are nitride ceramic substrates. A nitride ceramic forms titanium nitride by reacting with an active metal brazing material including Ti. Also, an oxide ceramic forms titanium oxide by reacting with an active metal brazing material including Ti. Alumina substrates, zirconium substrates, and Alusil substrates are oxide ceramic substrates.

The bonding strength between the conductor part and the nitride ceramic or the oxide ceramic can be increased by using active metal bonding. A reaction layer in which such titanium nitride or titanium oxide is formed is called a titanium reaction layer.

It is favorable for the conductor part to be a copper member or an aluminum member. The copper member is a copper plate, a copper alloy plate, a member made by providing a circuit configuration in a copper plate, or a member made by providing a circuit configuration in a copper alloy plate, and is made of copper or a copper alloy. The aluminum member is an aluminum plate, an aluminum alloy plate, a member made by providing a circuit configuration in an aluminum plate, or a member made by providing a circuit configuration in an aluminum alloy plate, and is made of aluminum or an aluminum alloy. Hereinafter, a member made by providing a circuit configuration in a copper plate is called a copper circuit. A member made by providing a circuit configuration in an aluminum plate is called an aluminum circuit. The conductor part may be a metalized layer or an electrically-conductive thin film other than a copper member or an aluminum member. The metalized layer is formed by firing a metal paste. An aluminum member is inexpensive compared with a copper member. On the other hand, compared with an aluminum member, a copper member is favorable because the thermal conductivity is excellent.

A copper plate or a copper circuit made of oxygen-free copper is an example of the copper plate or the copper circuit. Generally, the thermal conductivity of copper is high, i.e., about 400 W/m·K. To improve the heat dissipation, it is more favorable for the copper member to be a copper plate or a copper circuit made of oxygen-free copper.

The thicknesses of the conductor parts 3 and 4 may be not less than 0.3 mm, or even not less than 0.6 mm. The heat dissipation of the bonded body can be improved by making the conductor part thick. The thickness of the front conductor part 3 may be equal to the thickness of the back conductor part 4 or may be different from the thickness of the back conductor part 4. A copper plate or a copper circuit is especially favorable as the conductor part. It is favorable for the copper plate or the copper circuit to include oxygen-free copper. Oxygen-free copper has a copper purity of not less than 99.96 mass % as indicated in JIS-H-3100.

In the insulating circuit board according to the embodiment, in XPS analysis of the nitrogen amount at the surface of the conductor part, the average value of any three locations is within the range of not less than 0 at % and not more than 50 at %. The insulating circuit board according to the embodiment may include only one conductor part or may include multiple conductor parts. That is, the number of conductor parts provided is not particularly limited. When the insulating circuit board includes multiple conductor parts, it is sufficient for the average value of the nitrogen amounts of any three locations at the surface of one of the conductor parts to be within the range of not less than 0 at % and not more than 50 at %. More favorably, the average values of the nitrogen amounts of any three locations at each of the surfaces of the conductor parts are within the range of not less than 0 at % and not more than 50 at %.

The surface of the conductor part refers to the surface of the conductor part of at least one of the front conductor part 3 or the back conductor part 4. XPS analysis of the nitrogen amount at the surface of the conductor part is performed. XPS analysis refers to analysis using X-ray photoelectron spectroscopy (X-ray Photoelectron Spectroscopy: XPS). XPS analysis is a method in which X-rays are irradiated on a sample surface, and the kinetic energy of the photoelectrons released from the sample surface are measured. Because the penetration depth of the X-rays is several μm, XPS analysis is used for qualitative analysis and quantitative analysis of the sample surface.

The SSI Corporation X-probe or an equivalent or better device is used as the XPS analysis device. In the analysis, Al $K_\alpha$-rays (hv=1486.6 eV) are used, and the spot diameter of the X-rays is set to a diameter of 1 mm. In the XPS analysis, other than nitrogen and oxygen, the amount of carbon and the amounts of the metallic elements used in the conductor part also are measured.

When a copper member is used as the conductor part, nitrogen, oxygen, copper, and carbon are extracted from the measured components. The nitrogen amount is measured using the total of these components as 100 at %. When the copper member includes a copper alloy, nitrogen, oxygen, copper, the other metals of the alloy, and carbon are extracted from the measured components; and the total of these components is used as 100 at %.

When an aluminum member is used as the conductor part, nitrogen, oxygen, aluminum, and carbon are extracted from the measured components. The nitrogen amount is measured using the total of these components as 100 at %. When the aluminum member includes an aluminum alloy, nitrogen, oxygen, aluminum, the other metals of the alloy, and carbon are extracted from the measured components; and the total of these components is used as 100 at %.

According to the following embodiments, an example is described in which the conductor part includes a copper member, and the insulating substrate includes a ceramic substrate. The following description also is applicable to cases where the conductor part includes members other than a copper member. When an aluminum member is used as the conductor part, "copper member" can be replaced with "aluminum member" as appropriate in the following description. Similarly, when the insulating substrate includes a resin substrate other than a ceramic substrate, "ceramic substrate" can be replaced with resin substrate as appropriate in the following description.

According to the embodiment, the nitrogen amount at the surface of the copper member is measured by XPS analysis. The average value of any three locations of the surface is used as the nitrogen amount. The "surface" that is analyzed does not include the side surface of the copper member. Any three locations means three locations selected from the surface of one copper member. When measuring, three locations of which the most distal portions of the spot diameters are away from each other by not less than 500 μm are selected. It is favorable for the measurement locations not to overlap each other. Also, it is favorable for the measurement locations to be locations where the semiconductor element is mounted. The wettability between the copper member surface and the bonding layer can be improved by setting the nitrogen amount at the copper member surface to be within the range of not less than 0 at % and not more than 50 at %. A solder layer or a layer (a Ag nanoparticle layer) including silver as a major component is used as the bonding layer. The solder layer is, for example, a lead-free solder defined in JIS-Z-3282. JIS-Z-3282 corresponds to "ISO DIS 9453 2005". Lead-free solder mainly includes an alloy including Sn (tin). Cu and Sn are components that easily react with each other. The bond between the copper member and the semiconductor element can be secured thereby. In contrast, nitrogen is a component that obstructs the reaction of Sn and Cu. It is therefore important for the nitrogen amount at the surface of the copper member which is the conductor part to be not less than 0 at % and not more than 50 at %. In particular, it is more favorable for the nitrogen amount to be within the range of not less than 0 at % and not more than 50 at % no matter where the nitrogen amount is measured on the conductor part surface. When the average value of any three locations is calculated as described above, there are also cases where a location exists at which the nitrogen amount at a portion of the surface is greater than 50 at %. The characteristics can be further improved by the nitrogen amount being within the range of not less than 0 at % and not more than 50 at % no matter where the nitrogen amount is measured on the conductor part surface.

A nitrogen amount of 0 at % (atomic %) means that the nitrogen amount is below the detection limit of XPS analysis. Also, the wettability between the copper member surface and the bonding layer degrades when the nitrogen amount is greater than 50 at %. In conventional insulating circuit boards, and particularly in ceramic copper circuit boards, there are locations of the surface of the conductor part at which the nitrogen amount is not less than 60 at % where the semiconductor element is bonded via the bonding layer. The wettability between the conductor part and the bonding layer can be improved by setting the average value of the nitrogen amounts of any three locations to be not more than 50 at %.

Therefore, the nitrogen amount at the copper member surface is not less than 0 at % and not more than 50 at %. When a corrosion inhibitor is not used, it is favorable for the nitrogen amount to be not less than 0 at % and not more than 30 at %.

When a corrosion inhibitor is used, the nitrogen amount at the copper member surface may be not less than 10 at % and not more than 50 at %. When a corrosion inhibitor is used, a more desirable range of nitrogen amount is not less than 10 at % and not more than 30 at %.

The nitrogen amount can be controlled by using the cleaning process described below. It is therefore favorable to control the nitrogen amount according to the existence or absence of anti-rust treatment.

The lower the nitrogen amount at the copper member surface, the better. On the other hand, by controlling the oxygen amount at the copper member surface, as described below, the likelihood of discrepancies occurring can be reduced even when the nitrogen amount is not less than 10 at %.

In XPS analysis of the oxygen amount at the copper member surface, it is favorable for the average value of three locations to be within the range of not less than 3 at % and not more than 50 at %. The method of the XPS analysis is the same as the analysis method of the nitrogen amount. The three locations where the oxygen amounts are measured are the same as the three locations where the nitrogen amounts are measured. That is, both the nitrogen amount and the oxygen amount are measured by one XPS analysis. In other words, the amounts of nitrogen and oxygen present in the same measurement area are simultaneously measured.

When nitrogen is adhered to the copper member surface, the bonding between the copper member and the bonding layer is obstructed. It is therefore favorable for the nitrogen amount to be low. On the other hand, the presence of oxygen at the copper member surface can make it difficult for nitrogen to adhere to the copper member surface. By the presence of oxygen at the copper member surface suppressing the adhesion of nitrogen, the obstruction of the bonding between the copper member and the bonding layer by nitrogen can be suppressed. It is therefore favorable for oxygen to be present at the copper member surface. For example, when a chemical polishing process or an etching process is performed on the copper member surface, a portion of the copper crystal grains is removed from the grain boundaries between the copper crystal grains of the copper member. Therefore, micro recesses are formed in the grain boundary portions of the copper member. Nitrogen easily adheres to the micro recesses of the grain boundary portions. This is because by using a chemical liquid including nitrogen atoms, components of the chemical liquid easily remain in the recesses of the copper member surface, and nitrogen adheres to the copper member surface. For example, chemical liquids that include nitrogen atoms are compounds that include amino groups, etc. By the presence of oxygen at the copper plate surface, oxygen can be present in the recesses and can suppress the adhesion of nitrogen. There is also an effect of the oxygen covering the nitrogen present in the recesses. It is therefore favorable for the oxygen amount to be within the ranges described above.

Discrepancies due to nitrogen can be suppressed by setting the oxygen amount at the copper member surface to be not less than 3 at %. When the oxygen amount is less than 3 at %, the oxygen amount is insufficient. When the oxygen amount at the copper member surface is high, i.e., greater than 50 at %, the oxygen itself reacts with the copper member; and copper oxide is formed. Therefore, the thermal conductivity of the copper member may decrease. Accordingly, it is favorable for the oxygen amount at the copper member surface to be within the range of not less than 3 at % and not more than 50 at %. Also, when the oxygen amount at the copper member surface is within the range of not less than 3 at % and not more than 30 at %, the oxygen itself does not obstruct the bonding between the copper member and the bonding layer. When the oxygen amount is high, i.e., greater than 30 at %, the oxygen itself may cause obstruction of the bonding between the copper member and the bonding layer. Accordingly, it is more favorable for the oxygen amount at the copper member surface to be within the range of not less than 3 at % and not more than 30 at %.

Also, it is favorable for the ratio ($A_N/A_{OX}$) of the nitrogen amount ($A_N$) to the oxygen amount ($A_{OX}$) at the copper member surface to be not less than 0 and not more than 5. The nitrogen amount and the oxygen amount used to calculate the ratio are the average values of three locations described above. The ratio ($A_N/A_{OX}$) is 0 when the nitrogen amount is 0 at %. A ratio ($A_N/A_{OX}$) of not more than 5 means that the nitrogen amount is not more than 5 times the oxygen amount. When the ratio ($A_N/A_{OX}$) is large, i.e., greater than 5, the effects of suppressing the effects of nitrogen are insufficient. Also, it is favorable for the ratio ($A_N/A_{OX}$) to be not less than 0 and not more than 5 no matter where the ratio is measured on the copper member surface.

When anti-rust treatment is not performed, it is more favorable for the ratio ($A_N/A_{OX}$) at the copper member surface to be not less than 0 and not more than 4. On the other hand, when anti-rust treatment is performed, it is more favorable for the ratio $(A_N/A_{OX})$ at the copper member surface to be not less than 0.5 and not more than 4. That is, it is favorable for the ratio $(A_N/A_{OX})$ to be not less than 0.5 and not more than 4 when the nitrogen amount is not 0 at % at the copper member surface due to the anti-rust treatment. When anti-rust treatment is performed, reducing the nitrogen amount at the copper member surface to 0 at % (below the detection limit) may increase the burden on the manufacturing processes. It is effective to be able to reduce the effects even when nitrogen remains.

Also, it is favorable for the chlorine ion amount present at the surface of the insulating circuit board to be not less than 0 μg and not more than 15 μg per 40 cm² of the surface area of the insulating circuit board. It is more favorable for the chlorine ion amount to be not less than 0 μg and not more than 3 μg per 40 cm² of the surface area of the insulating circuit board.

It is favorable for the sulfate ion ($SO_4$) amount present at the surface of the insulating circuit board to be not less than 0 μg and not more than 5 μg per 40 cm² of the surface area of the insulating circuit board. Also, it is more favorable for the sulfate ion ($SO_4$) amount to be not less than 0 μg and not more than 0.5 μg per 40 cm² of the surface area of the insulating circuit board.

It is favorable for the fluorine ions present at the surface of the insulating circuit board to be not less than 0 μg and not more than 2 μg per 40 cm² of the surface area of the insulating circuit board. Also, it is more favorable for the fluorine ions to be not less than 0 μg and not more than 1 μg per 40 cm² of the surface area of the insulating circuit board.

It is favorable for the ammonium ($NH_4$) ions present at the surface of the insulating circuit board to be not less than 0 μg and not more than 3 μg per 40 cm² of the insulating circuit board surface area. Also, it is more favorable for the ammonium ions to be not less than 0 μg and not more than 1 μg per 40 cm² of the surface area of the insulating circuit board.

There is a tendency for the multiple ions described above to adhere more easily to the surface of the metal than to the surface of the insulating substrate. When present at the insulating substrate surface, the multiple ions described above may volatilize when bonding between the copper member and the semiconductor element and may induce contamination of the copper member surface. When the copper member surface is contaminated, bonding defects may be induced between the copper member and the semiconductor element. It is therefore favorable to control the above-mentioned ion amounts present at the entire surface of the insulating circuit board, including locations where the copper member is not bonded.

When the size of the surface area per insulating circuit board is less than 40 cm², it is favorable to use multiple substrates to set the total value of the surface areas of the insulating circuit board to be not less than 40 cm². This is because when the total value of the surface areas is less than 40 cm², that is, when the area of the insulating circuit board surface is extremely small, the effects of outliers or noise may be excessive when converted using proportional relationships. Here, the measured surface area is the area of the flat surface and does not include the thickness component of the side surface. The flat surface refers to the surface substantially parallel to the bonding surface of the insulating substrate with the conductor part when the insulating circuit board is viewed from above. For example, when viewed from above, the surface (the upper surface) and the back side (the lower surface) of the insulating substrate can be considered to be flat surfaces when the conductor part is provided not to jut from the insulating substrate end portion. Because the front and back of the insulating circuit board is used as the calculation object of the surface area, surface area=insulating substrate longitudinal dimension×lateral dimension×2. Also, when the conductor part juts from the insulating substrate end portion when viewed from above, the flat surface of the jutting conductor part also is counted as the surface area. Thus, the thickness components of the insulating substrate and the conductor part are not included in the calculation of the surface area.

Here, when considering a straight line connecting points at end portions of the insulating substrate, the upward direction is defined as a direction perpendicular to the straight line. The area of the flat surface is defined as the sum of the area when viewed from the upward direction and the area when viewed from the downward direction. Accordingly, the value of 2 times the area when viewed from the upward direction is used as the surface area of the insulating circuit board.

Also, when there is only a small amount of the insulating circuit board and the total value of the surface areas of the insulating circuit board is less than 40 cm², the size of the surface area may be converted by dividing the obtained impurity amount by the surface area (cm²) and then by multiplying by 40. Impurities refer to the chlorine ions, sulfate ions, fluorine ions, and ammonium ions described above. There is a proportional relationship of the surface area of the insulating circuit board and the impurity amount, so when the surface area per insulating circuit board is not 40 cm², it is sufficient to use the following formula to convert by using this relationship:

"impurity amount per 40 cm² of copper member"="impurity amount obtained by measurement"×40÷"total value of surface areas of insulating circuit board (cm²)"

The amounts of chlorine ions, sulfate ions, fluorine ions, and ammonium ions are measured by ion chromatography.

Chlorine ions easily adhere when an etching process of the copper plate is performed using a chemical liquid of iron chloride, copper chloride, etc. Also, adhesion easily occurs when hydrochloric acid is used when cleaning.

Sulfate ions easily adhere when an etching process or a chemical polishing process is performed on a layer including Ag or Cu as a major component by using a chemical liquid of sodium thiosulfate, sulfuric acid, ammonium peroxodisulfate, etc.

Fluorine ions easily adhere when an etching process of a Ti reaction layer is performed using a chemical liquid of ammonium fluoride, etc.

Ammonium ions easily adhere when an etching process of a Ti reaction layer, an etching process, a chemical polishing process, or the like of a layer including Ag or Cu as a major component, etc., are performed using a chemical liquid of ammonium fluoride, ammonium peroxodisulfate, etc.

When ions such as chlorine ions, sulfate ions, fluorine ions, and ammonium ions remain at the surface of the insulating circuit board (particularly the copper member surface), the reliability of the bonding between the copper member and the semiconductor element degrades. Also, the sulfate ions are divalent anions; and the chlorine ions and the fluorine ions are monovalent anions. The ammonium ions are monovalent cations.

It is sufficient for the components described as ions herein to be detected as ions in the measuring; these components may be present as compounds at the surface of the insulating circuit board.

It is favorable for the copper members to be bonded to two surfaces of the insulating substrate such as a ceramic substrate, a resin substrate, or the like and for the nitrogen amount to be within the range of not less than 0 at % and not more than 50 at % at the copper member surfaces of the two surfaces. As described above, the control of the nitrogen amount improves the bondability with the bonding layer. It is therefore important to control the nitrogen amount at the copper member surface where the bonding layer will be located. The bonding layer is a solder layer, a layer including silver as a major component, etc. When copper members are provided at the two surfaces of the ceramic substrate, a copper plate or copper circuit may be provided at the front side; and a copper plate may be provided as a heat dissipation plate at the backside. A semiconductor element is mounted to the copper plate or copper circuit at the front side. The bonding layer is used when mounting the semiconductor element. The heat dissipation plate is used as a surface mounted to a heat sink, etc. There are also cases where a bonding layer is not used to mount to a heat sink because grease or the like is used. However, by controlling the nitrogen amounts at the copper member surfaces of the two surfaces, either of the copper members at the front side and backside can be used as mounting surfaces of semiconductor elements. In other words, an easy-to-use insulating circuit board can be provided.

It is favorable for the ceramic substrate and the copper member to be bonded via a bonding layer that includes at least one of Ag, Cu, and selected from Ti. A bonding method that uses a bonding brazing material including Ti is called active metal bonding. The active metal bonding can securely bond the ceramic substrate and the copper member. The brazing material that is used in active metal bonding is called an active metal brazing material. It is favorable for the active metal brazing material to include not less than 0 mass % and not more than 70 mass % of Ag (silver), not less than 15 mass % and not more than 85 mass % of Cu (copper), and not less than 1 mass % and not more than 15 mass % of Ti (titanium) or $TiH_2$ (titanium hydride). Also, in the active metal brazing material, Nb or Zr may be used instead of Ti, or Nb and Zr may be added to Ti. However, it is favorable for the active metal brazing material to include not less than 1 mass % and not more than 15 mass % Ti (titanium) or $TiH_2$ (titanium hydride).

When both Ti and $TiH_2$ are used, the total of the two is set to be within the range of not less than 1 mass % and not more than 15 mass %. When both Ag and Cu are used, it is favorable for the content of Ag to be not less than 20 mass % and not more than 70 mass %, and for the content of Cu to be not less than 15 mass % and not more than 65 mass %.

The brazing material may include not less than 1 mass % and not more than 50 mass % of one or two of Sn (tin) or In (indium) as necessary. It is favorable for the content of Ti or $TiH_2$ to be not less than 1 mass % and not more than 15 mass %. Also, the brazing material may include not less than 0.1 mass % and not more than 2 mass % of C (carbon) as necessary.

The ratio of the active metal brazing material composition is calculated using the total of the mixed solid raw materials as 100 mass %. It is favorable for the solid raw materials to be powders. For example, when the active metal brazing material includes the three of Ag, Cu, and Ti, Ag+Cu+Ti=100 mass % is set. When the active metal brazing material includes the four of Ag, Cu, $TiH_2$, and In, Ag+Cu+$TiH_2$+In=100 mass % is set. When the active metal brazing material includes the five of Ag, Cu, Ti, Sn, and C, Ag+Cu+Ti+Sn+C=100 mass % is set.

For the powder raw materials having the compositions described above, it is favorable to mix solvents corresponding to the compositions. By mixing solvents, the brazing material can be in paste form.

Ag or Cu is a component used as the base material of the brazing material. Sn or In has the effect of lowering the melting point of the brazing material. C (carbon) has the effect of controlling the fluidity of the brazing material and controlling the composition of the bonding layer by reacting with other components. Therefore, Ag—Cu—Ti, Ag—Cu—Sn—Ti, Ag—Cu—Ti—C, Ag—Cu—Sn—Ti—C, Ag—Ti, Cu—Ti, Ag—Sn—Ti, Cu—Sn—Ti, Ag—Ti—C, Cu—Ti—C, Ag—Sn—Ti—C, and Cu—Sn—Ti—C are examples of the components of the brazing material. Also, In may be used instead of Sn. Both Sn and In may be used.

It is favorable for the side surface of the copper member described above to have an inclined shape. In other words, it is favorable for the side surface of the copper member to be inclined with respect to the in-plane direction and the thickness direction. The in-plane direction is a direction parallel to the bonding surface of the ceramic substrate with the copper member. The thickness direction is a direction connecting the ceramic substrate and the copper member and is perpendicular to the in-plane direction.

It is favorable for the thickness of the bonding layer 5 to be within the range of not less than 10 μm and not more than 60 μm. Also, in the insulating circuit board, it is favorable for the bonding layer to have a shape jutting from the side surface of the copper member. A portion of the jutting bonding layer is called the bonding layer jutting portion. It is favorable for the ratio (L/T) of a length L to a thickness T of the bonding layer jutting portion to be within the range of not less than 0.5 and not more than 3.0. The thickness of the bonding layer jutting portion is the thickness at the thickest location in the bonding layer jutting portion. The length of the bonding layer jutting portion is the length at the longest location jutting from the copper member side surface. The thickness and length of the bonding layer jutting portion are measured in any cross section of the ceramic copper circuit board. The TCT characteristics of the ceramic copper circuit board can be improved by providing the inclined shape in the copper member and by providing the bonding layer jutting portion.

It is favorable for the maximum height Rz of the copper member surface to be not more than 20 μm. Also, it is favorable for the arithmetic average roughness Ra of the copper member surface to be not more than 5 μm. It is more favorable for the arithmetic average roughness Ra to be not more than 2 μm. It is more favorable for the arithmetic average roughness Ra to be not more than 1 μm. By making the copper member surface flatter, the bonding with the solder layer or layer including silver as a major component can be secure. Ra and Rz are described in JIS B 0601:2013. JIS B 0601:2013 corresponds to ISO 4287:1997/Amendment 1:2009 (IDT).

It is favorable for the ceramic substrate to be a silicon nitride substrate having a thickness of not more than 0.4 mm, and for the thickness of the copper member to be not less than 0.6 mm. An effect of lowering the thermal resistance of the ceramic substrate is provided by using a thin silicon nitride substrate having a thickness of not more than 0.4 mm. Also, the heat dissipation is improved by using a thick copper member having a thickness of not less than 0.6 mm. Furthermore, the effects are easily obtained by using a silicon nitride substrate having a three-point bending strength of not less than 600 MPa.

11

Figure 2:
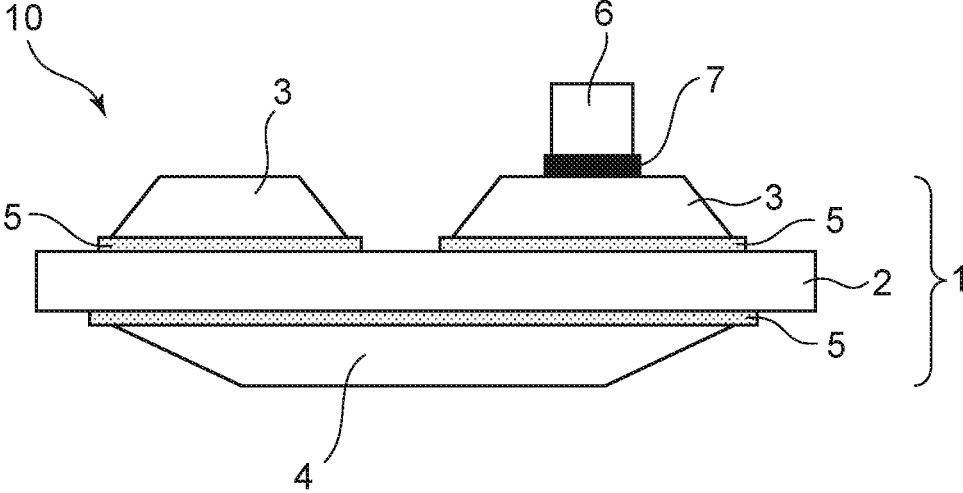
FIG. 2 is a schematic view showing an example of a semiconductor device according to the embodiment.

A ceramic copper circuit board such as those described above is favorable for a semiconductor device in which a semiconductor element is mounted via a bonding layer. FIG. 2 is a schematic view showing an example of a semiconductor device according to the embodiment. In FIG. 2, 1 is an insulating circuit board, 6 is a semiconductor element, 7 is a solder layer, and 10 is a semiconductor device. An example is shown in FIG. 2 in which one semiconductor element 6 is mounted. Two semiconductor elements 6 may be mounted. A leadframe, wire bonding, etc., may be included. A layer (a Ag nanoparticle layer) including silver as a major component may be used instead of the solder layer 7.

In the semiconductor device 10 according to the embodiment, the bonding between the conductor part 3, the solder layer 7, and the semiconductor element 6 can be secured because the nitrogen amount at the conductor part 3 surface is controlled. In recent years, semiconductor elements have higher performance. Accordingly, the junction temperatures of semiconductor elements are not less than 150° C., or even not less than 170° C. According to the semiconductor device 10 according to the embodiment, even when a semiconductor element having a high junction temperature is mounted, the occurrence of delamination of the solder layer 7, cracks, etc., can be suppressed, and the bonding reliability can be increased.

A method for manufacturing the ceramic copper circuit board according to the embodiment will now be described. The method for manufacturing the ceramic copper circuit board according to the embodiment is not particularly limited as long as the ceramic copper circuit board has the configuration described above. A method for obtaining the ceramic copper circuit board with a high yield will now be illustrated.

First, a bonded body of a ceramic substrate and a copper plate is made. The specific configurations of the ceramic substrate and the copper plate are as described above.

The bonded body is bonded using active metal bonding. Active metal bonding is a bonding method using an active metal brazing material that includes an active metal such as Ti, etc. The components of the active metal brazing material are as described above. The active metal brazing material paste is prepared and coated onto the surface of the ceramic substrate. It is favorable for the coating thickness of the active metal brazing material paste to be within the range of not less than 10 μm and not more than 60 μm. The copper plate is disposed on the active metal brazing material paste layer. The active metal brazing material paste may be coated onto the copper plate; and the ceramic substrate may be disposed on the copper plate.

The longitudinal and lateral sizes of the ceramic substrate may be equal to the longitudinal and lateral sizes of the copper plate or may be different from the longitudinal and lateral sizes of the copper plate. When the thickness of the copper plate is not less than 0.6 mm, it is favorable for the longitudinal and lateral sizes of the ceramic substrate and the longitudinal and lateral sizes of the copper plate to be the same. Also, it is favorable to provide copper plates at two surfaces of the ceramic substrate. Such a configuration makes it easier to reduce the warp of the bonded body. Any circuit configuration can be formed in the copper plate by the etching process described below. A copper member that is pre-patterned into a circuit configuration also can be bonded to the ceramic substrate. However, a specific-purpose die is necessary to prepare a copper member that is pre-patterned into a circuit configuration. The preparation of a die corresponding to the circuit configuration may cause a cost increase.

Then, a thermal bonding process is performed. It is favorable for the heating temperature to be not less than 600° C. and not more than 930° C. A vacuum, an inert atmosphere, etc., are examples of the heating atmosphere. A vacuum refers to a state in which the pressure is not more than $10^{-3}$ Pa. An inert atmosphere is a nitrogen atmosphere, argon atmosphere, helium atmosphere, neon atmosphere, xenon atmosphere, etc. In particular, when considering cost, a nitrogen atmosphere or an argon atmosphere is more favorable. A nitrogen atmosphere is more favorable. The bonded body of the ceramic substrate and the copper plate can be manufactured by performing the thermal bonding process. A warp correction process may be performed on the bonded body as necessary.

Then, a chemical polishing process and an etching process are performed on the bonded body. These processes are processes that provide the copper plate with a circuit configuration. These processes may provide the copper plate side surface with an inclined shape, and may form a bonding layer jutting portion in which the bonding layer juts from the copper plate side surface.

An active metal brazing material that includes Ag or Cu as a major component and includes Ti is used in the active metal bonding. In the bonded body that uses active metal bonding, a Ti reaction layer is formed inside the bonding layer. When a nitride ceramic substrate is used, the Ti reaction layer is a titanium nitride (TiN) layer. When an oxide ceramic substrate is used, the Ti reaction layer is a titanium oxide (TiO₂) layer. A Ti reaction layer and a layer including Ag or Cu as a major component are formed in the bonding layer of the bonded body manufactured by active metal bonding.

The nitride ceramic substrate is a substrate made of sialon, silicon nitride, aluminum nitride, etc.

The oxide ceramic substrate is a substrate made of alumina, zirconia, Alusil (a ceramic made of alumina and zirconia), etc.

To provide a circuit configuration in the etching process, an etching process of the copper plate, an etching process of the layer including Ag or Cu as a major component, and an etching process of the Ti reaction layer are necessary. Considering the etching efficiency, different chemical liquids are necessary for the three types of etching processes. Also, it is necessary to coat a resist onto locations not to be etched. Each time the location to be etched is changed, a resist removal process and a resist coating process are necessary. It is necessary to perform etching processes having different chemical liquids multiple times. For example, in the etching process of the copper plate, a chemical liquid that includes iron chloride or copper chloride is used. In the etching process of the layer including Ag or Cu as a major component, a chemical liquid that includes aqueous hydrogen peroxide or ammonium peroxodisulfide is used. The etching process of the Ti reaction layer uses a chemical liquid including aqueous hydrogen peroxide or ammonium fluoride. In addition, various chemical liquids also are used.

It is effective to use a chemical polishing process to increase the efficiency of the etching process. There are cases where the layer including Ag or Cu as a major component is oxidized by the chemical liquid of the etching process. A chemical polishing process is effective to remove the oxide layer. A chemical liquid that includes one, two, or more selected from sulfuric acid, hydrochloric acid, and sodium thiosulfate is used in the chemical polishing process. Also, various chemical liquids are used in the etching process.

Anti-rust treatment of the copper plate is performed as necessary. The anti-rust treatment is performed after the brazing material etching. The anti-rust treatment is processing to prevent the occurrence of rust (i.e., oxidization) of the copper plate. Generally, plating processing is performed for oxidation prevention. On the other hand, there are cases where anti-rust treatment is performed when plating processing is unnecessary. A chemical liquid of a benzotriazole compound including benzotriazole or the like is used in the anti-rust treatment. The benzotriazole compound is, for example, carboxybenzotriazole, etc.

These benzotriazole compounds include about three to eight nitrogen atoms per molecule. When remaining on the copper member surface, the benzotriazole compounds are detected as nitrogen atoms in the XPS analysis.

The copper plate at the front side is patterned by the chemical polishing process, the etching process, etc., described above. For example, a copper circuit is formed by providing the copper plate with a circuit configuration. Or, multiple copper plates are formed by subdividing one copper plate. A ceramic copper circuit board to which a copper member (a copper circuit or a copper plate) is bonded is obtained thereby. Also, various chemical liquids are used in the chemical polishing process, the etching process, the anti-rust treatment process, etc., as described above. Nitrogen adheres to the copper member surface when processes using chemical liquids are performed. To control the nitrogen amount at the copper member surface, it is effective to perform a cleaning process. In the cleaning process, one or two selected from water cleaning, alkaline cleaning, and alcohol cleaning are performed. Also, when only water cleaning is performed, it is favorable to perform the water cleaning process described below, which is a process without immersion, at least once. More favorably, if the cleaning process when only water cleaning is used is the cleaning process described below, the cleaning process becomes more favorable as the cleaning process is repeated. Also, multiple cleaning methods may be combined in one cleaning process. It is favorable for these cleanings to clean not only the conductor part but also the entire ceramic copper circuit board.

In the water cleaning, it is favorable for the flow rate to be not less than 1.3 L (liter)/minute. When the flow rate is not less than 1.3 L/minute, the effect of rinsing the nitrogen adhered to the copper member surface is sufficiently obtained. When the flow rate is less than 1.3 L/minute, the rinsing effect may be insufficient. For example, according to a method in which the bonded body is immersed and left in a cleaning tank containing water, the effect of reducing the nitrogen amount is insufficiently obtained because the flow rate is insufficient. Although not particularly limited, it is favorable for the upper limit of the flow rate to be not more than 10 L/minute. When the flow rate is large, i.e., greater than 10 L/minute, the water pressure may be too high and the copper member surface may deform. It is therefore favorable for the flow rate of the water cleaning to be not less than 1.3 L/minute and not more than 10 L/minute. More favorably, the flow rate of the water cleaning is not less than 1.5 L/minute and not more than 6 L/minute.

Methods that include control by circulating the water contained in the cleaning tank, control by using a nozzle, etc., are examples of methods for adjusting the flow rate. A method in which the adjustment of the flow rate is controlled using a nozzle is favorable. The flow rate is easily controlled by using a nozzle. According to the method in which the water contained in the cleaning tank is circulated, the control of the flow rate may be difficult when the amount of the water is high. When a nozzle is used, the flow rate of the water sprayed from the nozzle is set to be not less than 1.3 L/minute. Also, an ultrasonic wave may be applied to the water; and carbonic acid and/or oxygen may be dissolved in the water.

It is favorable for the distance between the nozzle and the ceramic copper circuit board to be within the range of not less than 5 cm and not more than 40 cm. It is more favorable to be within the range of not less than 5 cm and not more than 20 cm. When within these ranges, the amount of the water striking the ceramic copper circuit board is more easily adjusted. The impact shape of the water sprayed from the nozzle can have various shapes such as point, circular, elliptic, flattened, quadrilateral, etc. Various configurations such as cone-shaped, fan-shaped, etc., are applicable as the type of the nozzle. When nozzles are utilized, multiple nozzles per ceramic copper circuit board may be used, and the front conductor part and the back conductor part may be simultaneously cleaned.

It is favorable for the water amount that impacts the ceramic copper circuit board to be within the range of not less than 0.01 L/minute/cm$^2$ and not more than 0.1 L/minute/cm$^2$ per nozzle. The water amount that impacts the ceramic copper circuit board is called the water impact amount. The water impact amount indicates the water amount impacting per 1 cm$^2$ when the ceramic copper circuit board is viewed from above. The adjustment of the water impact amount on the ceramic copper circuit board can be performed using the water amount from the nozzle described above, the nozzle type, the distance between nozzles, etc. Also, air jets can be combined when spraying the water from the nozzle. Also, an ultrasonic wave may be provided in the cleaning process. It is also effective to perform the cleaning process while conveying the ceramic copper circuit board. At this time, the substrate may be obliquely positioned to increase the cleaning efficiency (the recovery efficiency of the liquid) and the installation area efficiency. Oblique means that the orientation of at least one side of the substrate is not parallel to a horizontal plane perpendicular to the direction of gravity. It is more favorable for the angle between the horizontal plane and the at least one side to be not less than 10 degrees but less than 90 degrees. An efficient method is to set the flow rate from the nozzle to be not less than 1.3 L/minute, and to set the water impact amount on the ceramic copper circuit board to be within the range of not less than 0.01 L/minute/cm$^2$ and not more than 0.1 L/minute/cm$^2$ per nozzle while conveying the ceramic copper circuit board.

It is favorable for the water to satisfy the quality of JIS-K-0557 (1998). JIS-K-0557 indicates the quality of A1 to A4. ISO 3696 is referenced by JIS-K-0557.

Alkaline cleaning refers to the process of cleaning with an alkaline aqueous solution having a pH of not less than 10. Aqueous solutions such as organic alkaline, metal hydroxide, a salt of a metal hydroxide and a weak acid, etc., are examples of alkaline aqueous solutions having a pH of not less than 10. In particular, lithium, potassium, sodium, barium, calcium, etc., are examples of the types of metals when metal hydroxides and their salts are used. When $K_b$ (the base dissociation constant) is too small, the necessary solute amount increases, and so it is favorable for the type of metal of the metal hydroxide and its salt that is used to be selected from potassium, sodium, and lithium. In particular, when considering cost, sodium hydroxide, sodium metasilicate, sodium carbonate, sodium phosphate, and tetrasodium diphosphate are favorable, and an aqueous solution including one, two, or more selected from these sodium compounds is favorable. An aqueous solution that includes not less than 0.5 mass % and not more than 5 mass % of these components is more favorable. Alkaline cleaning is effective for cleaning by removing impurities of the copper member surface.

It is favorable for the purity of these alkaline aqueous solutions to be high. It is more favorable for the purity to be not less than 96 mass %. When the purity is less than 96 mass %, impurities therein may adhere to the ceramic copper circuit board. A higher purity indicates fewer impurities included in the aqueous solution. Accordingly, a higher purity is favorable due to less adhesion of impurities. It is therefore more favorable for the purity to be not less than 98 mass %.

Also, benzotriazole compounds that are often used in anti-rust treatment have lower polarities than water and are soluble in organic solvents. Therefore, alcohol cleaning also may be used in the cleaning process after the anti-rust treatment, etc. Isopropanol, methanol, butanol, hexanol, ethanol, etc., are examples of alcohols.

It is favorable for the purity of the benzotriazole compounds other than water and solvent components in alcohols to be not less than 99 mass %. Impurities included inside the alcohols used in the alcohol cleaning may adhere to the ceramic copper circuit board when the purity other than water and solvent components is less than 99 mass %.

Also, a mixture of two or more types of alcohols may be used in the alcohol cleaning. Furthermore, alcohols may be mixed with water. When alcohols are mixed with water, it is favorable for the quality of the water that is used to satisfy JIS-K-0557 (1998). Benzene may be added to alcohols as a solvent. That is, it is favorable for the impurity amount of alcohols other than water or solvents to be not more than 1 mass %. Here, when considering the solubility and volatility of benzotriazole as well, ethanol or isopropanol is favorable. Isopropanol is CAS Registry Number 67-63-0 and has an IUPAC name of 2-propanol. The isopropanol is also called IPA or isopropyl alcohol.

When considering cost, alkaline cleaning or water cleaning is more favorable than alcohol cleaning as the cleaning method. Also, multiple cleaning methods may be combined such as performing water cleaning after alkaline cleaning, etc.

By performing a cleaning process such as those described above, the nitrogen amount at the copper member surface can be reduced to be not more than 50 at %. Also, it is favorable to perform the cleaning process after the chemical polishing process, the etching process, and the anti-rust treatment process. The cleaning methods described above may be performed as the cleaning of the final process among the chemical polishing process, the etching process, and the anti-rust treatment process; and the cleaning after the other processes may be normal water cleaning. In such a case, it is favorable to set the time of the cleaning process after the final process to be long compared to the other cleaning. Also, the individual cleaning processes may be either batch or continuous. The batch technique is a method in which the cleaning process is performed with multiple bonded bodies placed in a cleaning basket. The continuous technique is a method in which the cleaning process is performed while a belt conveyor conveys multiple bonded bodies.

Cleaning methods also include methods that use a chlorine-based cleaning agent. A chlorine-based cleaning agent may increase the chlorine amount at the copper plate surface. Therefore, chlorine-based cleaning agents are unfavorable compared to the cleaning methods described above. Also, cleaning processes that use water vapor and ozone water are unfavorable because the copper plate may be oxidized. Therefore, one, two, or more cleaning processes selected from water cleaning, alkaline cleaning, and alcohol cleaning are favorable.

By the processes described above, the ceramic copper circuit board according to the embodiment in which the nitrogen amount at the copper member surface is reduced can be manufactured.

Drying processes will now be described. Processing with an easily-volatilized solution, centrifugal force processing, air blow processing, etc., are examples of drying processes. Multiple drying processes may be combined. The water that remains on the ceramic copper circuit board after cleaning may be rinsed away by using easily-volatilized solvent such as alcohols such as methanol, ethanol, isopropanol, or the like, ketones such as acetone, etc. It is favorable for the purity of these solvents to be not less than 99 mass %. When the purity is less than 99 mass %, the impurities included therein may adhere to the ceramic copper circuit board. In such a case, considering safety such as flammability, etc., it is favorable to use isopropanol. Also, the remaining water droplets may be removed using a centrifugal force by rotating the ceramic copper circuit board after cleaning.

Also, the ceramic copper circuit board may be positioned obliquely. Oblique refers to the state in which the orientation of any one or more sides of the substrate is not parallel to the horizontal direction, where any orientation existing in a plane perpendicular to the direction of gravity is taken as the horizontal direction. In such a case, when the angle between the horizontal direction and the direction of gravity is taken to be 90 degrees, it is more favorable for the angle between the horizontal direction and the orientation of any one or more sides of the substrate to be not less than 10 degrees but less than 90 degrees. It is more favorable for the orientation of the substrate to be such that the diagonals of the substrate are oblique. Thus, by setting the orientation of the substrate to be oblique, the water droplets adhered to the substrate easily fall due to gravity. For example, making the diagonals of the substrate oblique is an example of a method for making oblique.

The remaining water droplets on the ceramic copper circuit board thus dried somewhat may be blown off by blowing dry air or nitrogen gas. A method in which air, dry air, or nitrogen gas is blown is also called an air knife. An air knife is one type of air blowing.

To more reliably dry the ceramic copper circuit board thus obtained, air may strike the ceramic copper circuit board with a temperature of not less than 10° C., a humidity of not more than 70%, and an air velocity of not less than 20 m/s and not more than 150 m/s. The drying process of thus striking the ceramic copper circuit board with air is called air blowing. Also, a favorable air temperature in the air blow process is not less than 10° C. and not more than 150° C., and more favorably not less than 15° C. but less than 100° C. When this temperature is exceeded, the conductor part surface may be oxidized by heat. Also, a favorable humidity in the air blow process is not less than 5% and not more than 70%. When the humidity is greater than 70%, the time of the drying process may lengthen. The cost may increase when the humidity is less than 5%. It is favorable for the air velocity to be not less than 20 m/s and not more than 150 m/s. It is more favorable for the air velocity to be not less than 20 m/s and not more than 100 m/s. Drying takes time when the air velocity is too low. Also, when the air velocity is too high, unfavorable effects on the conveyance of the copper plate may occur. When performing the drying processes, oxidization of the copper plate surface, i.e., the conductor part, by the heat of the warm air can be suppressed by combining other drying processes to reduce the drying time of applying warm air when using the warm air drying process. Therefore, multiple drying processes may be combined.

EXAMPLES

Examples 1 to 12 and Comparative Examples 1 to 2

Ceramic substrates (silicon nitride substrates and aluminum nitride substrates) were prepared as examples of insulating substrates. The size of the prepared silicon nitride substrate was 50 mm long×40 mm wide×0.32 mm thick. The thermal conductivity was 90 W/m·K, and the three-point bending strength was 650 MPa. Also, the size of the prepared aluminum nitride substrate was 50 mm long×40 mm wide×0.635 mm thick. The thermal conductivity was 170 W/m·K, and the three-point bending strength was 400 MPa.

Copper plates (oxygen-free copper plates) were prepared as examples of conductor parts. The size of the copper plate was 50 mm long×40 mm wide. Then, the ceramic substrate and the copper plate were bonded by active metal bonding using an active metal brazing material including Ti. Copper plates were bonded respectively to two surfaces of the ceramic substrate. Table 1 shows the thicknesses of the copper plates and the thicknesses of the bonding layers. Bonded bodies according to the examples 1 to 12 and the comparative examples 1 and 2 were manufactured by this process.

TABLE 1

|  | Ceramic substrate | Copper plate thickness (mm) | Bonding layer thickness (μm) |
|---|---|---|---|
| Example 1 | Silicon nitride substrate | 0.8 | 50 |
| Example 2 | Silicon nitride substrate | 0.8 | 40 |
| Example 3 | Silicon nitride substrate | 0.6 | 30 |
| Example 4 | Silicon nitride substrate | 0.6 | 30 |
| Example 5 | Silicon nitride substrate | 0.6 | 20 |
| Example 6 | Silicon nitride substrate | 0.7 | 35 |
| Example 7 | Silicon nitride substrate | 0.7 | 30 |
| Example 8 | Silicon nitride substrate | 0.6 | 20 |
| Example 9 | Aluminum nitride substrate | 0.5 | 20 |
| Example 10 | Aluminum nitride substrate | 0.3 | 30 |
| Example 11 | Aluminum nitride substrate | 0.3 | 40 |
| Example 12 | Aluminum nitride substrate | 0.3 | 40 |
| Comparative example 1 | Silicon nitride substrate | 0.8 | 50 |
| Comparative example 2 | Silicon nitride substrate | 0.8 | 50 |

Then, an etching process and a chemical polishing process were performed on the bonded bodies, and an anti-rust treatment process also was performed. The ceramic copper circuit boards which were examples of the insulating circuit board were made thereby. The ceramic copper circuit boards that were made on the front side included copper plates (copper circuits) provided with circuit configurations, and included copper plates as heat dissipation plates on the backside. The copper circuit of the front side and the copper plate of the backside each were examples of conductor parts. The side surfaces of the copper circuit and the copper plate were provided with inclined shapes. Also, bonding layer jutting portions in which the bonding layers jutted from the copper plate side surface were provided. The ratio of the length to the thickness of the bonding layer jutting portion was set to be within the range of not less than 0.5 and not more than 3.0. Also, the surface roughness Ra of the copper circuit surface after the patterning by etching was not more than 1 μm.

The etching process and the chemical polishing process were performed in the order of copper plate etching process→chemical polishing process (first chemical polishing process)→etching process of bonding layer including Ag or Cu as major component→chemical polishing process (second chemical polishing process)→etching process of titanium nitride layer→anti-rust treatment process. The cleaning processes after the processes were performed using the conditions shown in Table 2. Also, in the cleaning process, in the case of water cleaning, the water amount emitted from the nozzle was set to be within the range of not less than 1.5 L/minute and not more than 6 L/minute. The cleaning processes were performed while conveying the ceramic copper circuit boards. Accordingly, the water impact amounts on the ceramic copper circuit boards per nozzle were set to the water amounts shown in Table 2. Also, the cleaning processes in which the bonded bodies were immersed in a water cleaning tank are indicated by "immersion". The case where alkaline cleaning was used is indicated by "alkaline".

The drying process was as follows.

For the drying processes of the ceramic copper circuit boards, a drying process by air blowing was performed after a drying process by air knife for the examples 1 to 12 and the comparative example 1. The temperatures of the air knife and the air blowing were room temperature (25° C. vicinity). The other conditions of the drying process were a humidity of about 50% and an air velocity of about 20 to 60 m/s. For the comparative example 2, cleaning was performed at conditions similar to those of the comparative example 1, after which natural drying was performed. Examples in which anti-rust treatment was not performed are marked with "- (hyphen)" in the column of the cleaning after the anti-rust treatment process. Also, compared with the comparative example 1, the time for drying in the comparative example 2 was long. Thus, it is considered that the oxidization progresses because the time for drying was long.

TABLE 2

| | Water impact amount of cleaning process (L/min/cm$^2$) | | | | | |
|---|---|---|---|---|---|---|
| | After copper plate etching process | After first chemical polishing process | After bonding layer etching process | After second chemical polishing process | After reaction layer etching process | After anti-rust treatment process |
| Example 1 | 0.02 | 0.02 | 0.04 | 0.04 | 0.04 | 0.04 |
| Example 2 | 0.03 | 0.03 | Immersion | 0.03 | Immersion | 0.03 |

TABLE 2-continued

| | Water impact amount of cleaning process (L/min/cm²) | | | | | |
|---|---|---|---|---|---|---|
| | After copper plate etching process | After first chemical polishing process | After bonding layer etching process | After second chemical polishing process | After reaction layer etching process | After anti-rust treatment process |
| Example 3 | 0.01 | 0.01 | Immersion | Immersion | 0.02 | 0.08 |
| Example 4 | 0.01 | 0.02 | Immersion | Immersion | 0.03 | Alkaline |
| Example 5 | 0.03 | 0.03 | 0.03 | 0.02 | Immersion | 0.02 |
| Example 6 | 0.09 | 0.10 | 0.09 | 0.08 | 0.10 | — |
| Example 7 | 0.02 | 0.01 | Immersion | Immersion | Immersion | 0.01 |
| Example 8 | 0.10 | 0.10 | 0.09 | 0.09 | 0.10 | 0.05 |
| Example 9 | Immersion | 0.02 | 0.01 | 0.04 | 0.05 | — |
| Example 10 | 0.06 | 0.02 | Immersion | 0.04 | Immersion | 0.05 |
| Example 11 | 0.03 | 0.03 | Immersion | 0.03 | 0.05 | — |
| Example 12 | 0.04 | 0.03 | Immersion | 0.02 | 0.05 | Alkaline |
| Comparative example 1 | Immersion | Immersion | Immersion | Immersion | Immersion | Immersion |
| Comparative example 2 | Immersion | Immersion | Immersion | Immersion | Immersion | Immersion |

The nitrogen amount and oxygen amount at the copper member surface of the ceramic copper circuit board were measured for the examples and the comparative examples. XPS analysis was used to measure the nitrogen amount and oxygen amount. An SSI Corporation X-probe was used as the XPS analysis device. In the XPS analysis, Al $K_\alpha$-rays (hν=1486.6 eV) were used, and the spot diameter of the X-rays was set to a diameter of 1 mm. In the XPS analysis, the amounts of nitrogen, oxygen, copper, and carbon were analyzed. The amounts of the components were calculated using the total of nitrogen, oxygen, copper, and carbon as 100 at %. The measurement results of the nitrogen amount and oxygen amount are shown in Table 3.

TABLE 3

| | Copper circuit surface | | |
|---|---|---|---|
| | Nitrogen amount (at %) | Oxygen amount (at %) | Nitrogen amount/ oxygen amount ratio |
| Example 1 | 10 | 8 | 1.3 |
| Example 2 | 14 | 13 | 1.1 |
| Example 3 | 19 | 17 | 1.3 |
| Example 4 | 11 | 13 | 1.1 |
| Example 5 | 25 | 13 | 1.9 |
| Example 6 | 4 | 25 | 0.2 |
| Example 7 | 49 | 15 | 3.3 |
| Example 8 | 0 | 10 | 0 |
| Example 9 | 30 | 58 | 0.5 |
| Example 10 | 28 | 18 | 1.6 |
| Example 11 | 35 | 50 | 0.6 |
| Example 12 | 20 | 16 | 1.3 |
| Comparative example 1 | 62 | 33 | 1.9 |
| Comparative example 2 | 64 | 53 | 1.2 |

The amounts of the chlorine ions, ammonium ions, sulfate ions, and fluorine ions present at the surfaces of the ceramic copper circuit boards were measured for the examples and the comparative examples. Ion chromatography analysis was used to measure the amounts of the chlorine ions, ammonium ions, sulfate ions, and fluorine ions. A DX500 made by Nippon Dionex K. K. was used as the ion chromatography analysis device. Also, for ion extraction, two samples and 40 ml of ultrapure water were placed in a cleaned fluorocarbon resin container (Φ100 mm), the lid of the fluorocarbon resin container was closed, and the ion components were extracted by maintaining for 18 hours at 80° C. in a constant temperature chamber.

Then, cool down was performed for about 1 hour, washing was performed together, and sampling was performed in auto sampling tubes. The measurement methods respectively for anions and cations were as follows.

For the anions (the fluorine ions, chlorine ions, sulfate ions, etc.), the Dionex Anion Standard (product number: 056933) made by Thermo SCIENTIFIC was used with 10-fold dilution as the calibration curve standard sample. Also, for the columns, IonPac AS4A-SC was used as the separation column, and IonPac AG4A-SC was used as the guard column. 30 ml of potassium hydroxide (KOH) was used as the eluent.

For the cations (ammonium ions, etc.), the Dionex Cation-II Standard (product number: 046070) made by Thermo SCIENTIFIC was used with 100-fold dilution as the calibration curve standard sample. Also, for the columns, IonPac CS12A was used as the separation column, and IonPac CG12A was used as the guard column. 20 ml of methanesulfonic acid was used as the eluent.

In the ion chromatography analysis, the measurement was performed using two ceramic copper circuit boards. Therefore, the obtained ion amount divided by 2 was used as the impurity amount of the ions per ceramic copper circuit board. Here, those marked with 0 were below the detection limit. The surface area per ceramic copper circuit board was 40 cm².

The measurement results of the ion amounts of the examples and the comparative examples are shown in Table 4.

TABLE 4

| | Copper plate surface | | | |
|---|---|---|---|---|
| | Chlorine ions (μg/ substrate) | Ammonium ions (μg/ substrate) | Sulfate ions (μg/ substrate) | Fluorine ions (μg/ substrate) |
| Example 1 | 4 | 0.9 | 0.6 | 0.1 |
| Example 2 | 7 | 1.4 | 1.4 | 0.4 |
| Example 3 | 10 | 2.0 | 2.3 | 0.6 |
| Example 4 | 8 | 0.3 | 1.7 | 0.7 |
| Example 5 | 12 | 2.2 | 2.5 | 1.2 |
| Example 6 | 3 | 0.5 | 0.4 | 0.2 |
| Example 7 | 2 | 0.3 | 0.3 | 0.1 |

TABLE 4-continued

| | Copper plate surface | | | |
|---|---|---|---|---|
| | Chlorine ions (µg/ substrate) | Ammonium ions (µg/ substrate) | Sulfate ions (µg/ substrate) | Fluorine ions (µg/ substrate) |
| Example 8 | 0 | 0 | 0 | 0 |
| Example 9 | 7 | 0.8 | 0.4 | 0.2 |
| Example 10 | 15 | 2.6 | 3.9 | 1.6 |
| Example 11 | 16 | 3.0 | 4.9 | 2.0 |
| Example 12 | 10 | 0.8 | 3.6 | 1.7 |
| Comparative example 1 | 20 | 4.5 | 8.0 | 3.6 |
| Comparative example 2 | 21 | 4.6 | 8.0 | 3.6 |

It can be seen from Table 4 that the nitrogen amount and oxygen amount of the copper circuit surface were within the desirable ranges in the ceramic copper circuit boards according to the examples 1 to 12. The nitrogen amount and oxygen amount at the back copper plate surface had equivalent values.

The nitrogen amount was high, i.e., 62 at % for only the cleaning process of immersing in the water cleaning tank as in the comparative example 1. When natural drying was performed without a contrivance for the drying process as in the comparative example 2, the drying took time, and the adhered oxygen amount increased during that time.

Then, solder layers were formed as an example of the bonding layer on the ceramic copper circuit boards according to the examples and the comparative examples, and semiconductor elements were mounted on the solder layers. The semiconductor devices were manufactured thereby. The solder layers were lead-free solder. The bonding reliability of the semiconductor element was evaluated for the semiconductor devices.

TCT tests of the semiconductor devices were performed to check the bonding reliability. The TCT test was performed using −40° C.×30 minutes→room temperature×10 minutes→170° C.×30 minutes room temperature×10 minutes as 1 cycle, and a test of 500 cycles was performed. The bonding strength of the semiconductor element before testing and the bonding strength of the semiconductor element after testing were measured. The bonding strength was measured using a peel test. The results were best (double circle) when the reduction rate of the bonding strength after testing was not more than 10% with respect to the bonding strength before testing. The semiconductor devices having reduction rates of greater than 10% and not more than 15% were good 1 (white circle). The semiconductor devices having reduction rates of greater than 15% and not more than 20% were good 2 (black circle). The semiconductor devices having reduction rates of greater than 20% and not more than 25% were defective 1 (×). The semiconductor devices having reduction rates of greater than 25% were defective 2 (××). Also, two semiconductor elements were bonded on the copper plate via the solder layer. A peel test was performed before testing for one, and a peel test was performed after testing for the other. The reduction rates were measured from these results. The results are shown in Table 5.

TABLE 5

| | Bonding reliability |
|---|---|
| Example 1 | ◎ |
| Example 2 | ◎ |

TABLE 5-continued

| | Bonding reliability |
|---|---|
| Example 3 | ◎ |
| Example 4 | ◎ |
| Example 5 | ◎ |
| Example 6 | ◎ |
| Example 7 | ○ |
| Example 8 | ◎ |
| Example 9 | ● |
| Example 10 | ◎ |
| Example 11 | ◎ |
| Example 12 | ◎ |
| Comparative example 1 | X |
| Comparative example 2 | X X |

It can be seen from Table 5 that the bonding reliability via the solder layer was improved for the ceramic copper circuit boards according to the examples. In contrast, in the comparative example 1, the reliability was degraded because the nitrogen amount at the copper circuit surface was high. Therefore, it was found that the control of the nitrogen amount and the oxygen amount at the copper circuit surface was effective to improve the bonding reliability. It was found to be particularly effective in semiconductor devices in which semiconductor elements were mounted using lead-free solder layers.

While certain embodiments of the inventions have been illustrated, these embodiments have been presented by way of example only, and are not intended to limit the scope of the inventions. These novel embodiments may be embodied in a variety of other forms; and various omissions, substitutions, modifications, etc., can be made without departing from the spirit of the inventions. These embodiments and their modifications are within the scope and spirit of the inventions and are within the scope of the inventions described in the claims and their equivalents. Also, the embodiments described above can be implemented in combination with each other.

What is claimed is:

1. An insulating circuit board, comprising:
an insulating substrate made of a ceramic; and
a copper member made of copper or a copper alloy, the copper member having a first surface and a second surface opposite to the first surface, the first surface being bonded to the insulating substrate via a bonding layer, the bonding layer including at least one selected from the group consisting of Ag, Cu, and Ti,
in XPS analysis of a nitrogen amount at the second surface of the copper member, an average value of the nitrogen amount at any three locations being within a range of not less than 0 at % and not more than 50 at %,
in XPS analysis of an oxygen amount at the second surface of the copper member, an average value of the oxygen amount at the three locations being within a range of not less than 0 at % and not more than 50 at %,
in measurement of chlorine ions present at a surface of the insulating circuit board by ion chromatography, an amount of the chlorine ions being not less than 0 µg and not more than 15 µg per 40 cm².

2. The insulating circuit board according to claim 1, wherein
the average value of the nitrogen amount is within a range of not less than 0 at % and not more than 30 at %.

3. The insulating circuit board according to claim 1, wherein the average value of the nitrogen amount at the three locations is within a range of more than 7 at % and not more than 50 at %.

4. The insulating circuit board according to claim 1, wherein in XPS analysis of an oxygen amount at the second surface of the copper member, an average value of the oxygen amount at the three locations is within a range of not less than 3 at % and not more than 30 at %.

5. The insulating circuit board according to claim 1, wherein the insulating substrate includes at least one of silicon nitride or aluminum nitride as a major component.

6. The insulating circuit board according to claim 1 wherein a plurality of the copper members is bonded respectively to two surfaces of the insulating substrate, and the average value of the nitrogen amount is within a range of not less than 0 at % and not more than 50 at % at each of the second surfaces of the plurality of copper members.

7. The insulating circuit board according to claim 1, wherein in measurement of ammonium ions present at a surface of the insulating circuit board by ion chromatography, an amount of the ammonium ions is not less than 0 µg and not more than 3 µg per 40 cm$^2$.

8. The insulating circuit board according to claim 1, wherein a maximum height Rz of the copper member is not more than 20 µm.

9. The insulating circuit board according to claim 1, wherein a surface roughness Ra of the copper member is not more than 2 µm.

10. The insulating circuit board according to claim 1, wherein the insulating substrate is a silicon nitride substrate having a thickness of not more than 0.4 mm, and the copper member has a thickness of not less than 0.6 mm.

11. A semiconductor device, comprising:

the insulating circuit board according to claim 1; and a semiconductor element mounted on the second surface via a solder layer or a layer including silver as a major component.

12. The insulating circuit board according to claim 3, wherein a ratio of the average value of the nitrogen amount to the average value of the oxygen amount is not less than 0 and not more than 5.

13. An insulating circuit board, comprising:

an insulating substrate made of a ceramic; and a copper member made of copper or a copper alloy, the copper member having a first surface and a second surface opposite to the first surface, the first surface being bonded to the insulating substrate via a bonding layer, the bonding layer including at least one selected from the group consisting of Ag, Cu, and Ti, in XPS analysis of a nitrogen amount at the second surface of the copper member, an average value of the nitrogen amount at any three locations being within a range of not less than 0 at % and not more than 50 at %, in XPS analysis of an oxygen amount at the second surface of the copper member, an average value of the oxygen amount at the three locations being within a range of not less than 0 at % and not more than 50 at %, in measurement of sulfate ions present at a surface of the insulating circuit board by ion chromatography, an amount of the sulfate ions being not less than 0 µg and not more than 5 µg per 40 cm$^2$.

14. An insulating circuit board, comprising:

an insulating substrate made of a ceramic; and a copper member made of copper or a copper alloy, the copper member having a first surface and a second surface opposite to the first surface, the first surface being bonded to the insulating substrate via a bonding layer, the bonding layer including at least one selected from the group consisting of Ag, Cu, and Ti, in XPS analysis of a nitrogen amount at the second surface of the copper member, an average value of the nitrogen amount at any three locations being within a range of not less than 0 at % and not more than 50 at %, in XPS analysis of an oxygen amount at the second surface of the copper member, an average value of the oxygen amount at the three locations being within a range of not less than 0) at % and not more than 50 at %, in measurement of fluorine ions present at a surface of the insulating circuit board by ion chromatography, an amount of the fluorine ions is not less than 0 µg and not more than 2 µg per 40 cm$^2$.

15. An insulating circuit board, comprising:

an insulating substrate; and a conductor part bonded to at least one surface of the insulating substrate, in XPS analysis of a nitrogen amount at a surface of the conductor part, an average value of the nitrogen amount at any three locations being within a range of not less than 0 at % and not more than 50 at %, wherein in measurement of chlorine ions present at a surface of the insulating circuit board by ion chromatography, an amount of the chlorine ions is not less than 0 µg and not more than 15 µg per 40 cm$^2$.

16. A semiconductor device, comprising:

the insulating circuit board according to claim 15; and a semiconductor element mounted on the conductor part via a solder layer or a layer including silver as a major component.

* * * * *